United States Patent
Hasegawa et al.

(10) Patent No.: US 6,455,206 B1
(45) Date of Patent: *Sep. 24, 2002

(54) IMAGE FORMING METHOD, IMAGE FORMING APPARATUS AND IMAGE RECORDING MATERIAL

(75) Inventors: Takuji Hasegawa; Toshikazu Umeda, both of Hino (JP)

(73) Assignee: Konica Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/258,975

(22) Filed: Feb. 26, 1999

(30) Foreign Application Priority Data

Mar. 6, 1998 (JP) ............................................. 10-055080

(51) Int. Cl.$^7$ .............................. G03F 9/00; G11B 7/24; G03C 5/00
(52) U.S. Cl. ......................... 430/7; 430/322; 430/325; 430/945; 430/270.11
(58) Field of Search ............................ 430/270.11, 945, 430/495.1, 496, 270.12, 270.14, 322, 325, 7

(56) References Cited

U.S. PATENT DOCUMENTS

| | | | | |
|---|---|---|---|---|
| 5,041,369 A | * | 8/1991 | Fukui et al. | 430/619 |
| 5,352,562 A | * | 10/1994 | Takahashi et al. | 430/253 |
| 5,824,450 A | * | 10/1998 | Abe | 430/269 |
| 5,846,626 A | * | 12/1998 | Kashiwagi et al. | 428/64.1 |
| 6,022,664 A | * | 2/2000 | Washizu et al. | 430/138 |

* cited by examiner

*Primary Examiner*—Mark F. Huff
*Assistant Examiner*—Saleha R. Mohamedulla
(74) *Attorney, Agent, or Firm*—Frishauf, Holz, Goodman & Chick, P.C.

(57) ABSTRACT

An image forming method comprising the following steps, a step for imagewise exposing a recording material having an image forming layer to a laser beam light based on an image information and making at least a part of an exposed portion of said image forming layer removable, a step for forming an image by removing said image forming layer which is able to be removed, wherein radiation of said laser beam light corresponding to one dot in response to said image information makes a removable amount of said image forming layer variable.

4 Claims, 2 Drawing Sheets

IMAGE FORMING METHOD, IMAGE FORMING APPARATUS AND IMAGE RECORDING MATERIAL

FIELD OF THE INVENTION

The present invention relates to an image forming method, especially to an image forming method in which an image with high resolving power can be output stably by using an area gradation and an image forming apparatus using said image forming method and an image recording material.

BACKGROUND OF THE INVENTION

Heretofore, the recording method is well known which comprises the step of exposing to condensed light energy such as laser beam light, etc., an image forming material, whereby a part of recording material is deformed, released, burnt or evaporated and removed. This method is a dry process in which a processing solution containing a chemical is not employed, and only the exposed portions are melt-deformed, released or evaporated, which has an advantage resulting in high contrast. This method is used for an optical recording material such as a resist material and an optical disc, a transparent image for medical diagnosis, or a transparent manuscript in making printing plate. Hereinafter, these image forming methods are defined as ablation.

Japanese Patent Publication Open to Public Inspection (hereinafter referred to as JP-A) Nos. 59-5447, 59-105638, and 62-115153 disclose an image forming method by ablation in which a binder resin is photo-degraded by a pattern exposure to form a resist and also disclose raw materials necessary to perform this method. JP-A Nos. 55-132536, 57-27788, and 57-103137 disclose a method in which a thin inorganic compound layer provided by evaporation-deposit is exposed to record information by melt-deformation. JP-A Nos. 64-56591, 1-99887, and 6-40163 disclose raw materials necessary to perform a method in which a colored binder resin is removed by light heat conversion to record information, and U.S. Pat. No. 4,245,003 disclose an image forming material comprising an image forming layer containing graphite or carbon black.

JP-A Nos.8-310124, 8-334894, 8-337053, 8-337054, 8-337055, 8-337056, 9-15849, 9-106079, and 9-226236 propose an image forming material comprising ferromagnetic powder particles as a coloring material, which are used to obtain an image with few stain and high resolving power.

SUMMARY OF THE INVENTION

However, the above mentioned image forming materials are excellent in shielding light in the region of light sensitive wavelength of printing plate as well as a transparent manuscript in making printing plate, but these image density is insufficient for a transparent image in medical diagnosis.

In cases where these image forming materials are employed for the transparent image in medical diagnosis, density gradation is required, but unevenness in a continuous gradation portion is occasionally marked depending on an exposing apparatus with these image forming materials. As a means to solve this problem, there may be a method in which the condensed light diameter of laser beam light is made small to attain high density of image element so that the resolving power is enhanced, but because an apparatus to condense light is complex, and because cost is high and exposure time is long, this method is not employed in practical use.

To overcome the above mentioned shortcomings, JP-A No. 9-109462 discloses an image forming material in which dyestuff is contained in the high density region of an image of said image forming material so as to give gradation. However, there has been a problem that a gradation changed with the passage of time with this material.

The present invention has been made to overcome the above problems. An object of the invention is to provide an image forming method in which an image density consisting of binary coding image density is enhanced and a gradation of an image consisting of binary coding image density is given, and to provide an image recording material formed by the method.

DETAILED DESCRIPTION OF THE INVENTION

Figure 1:
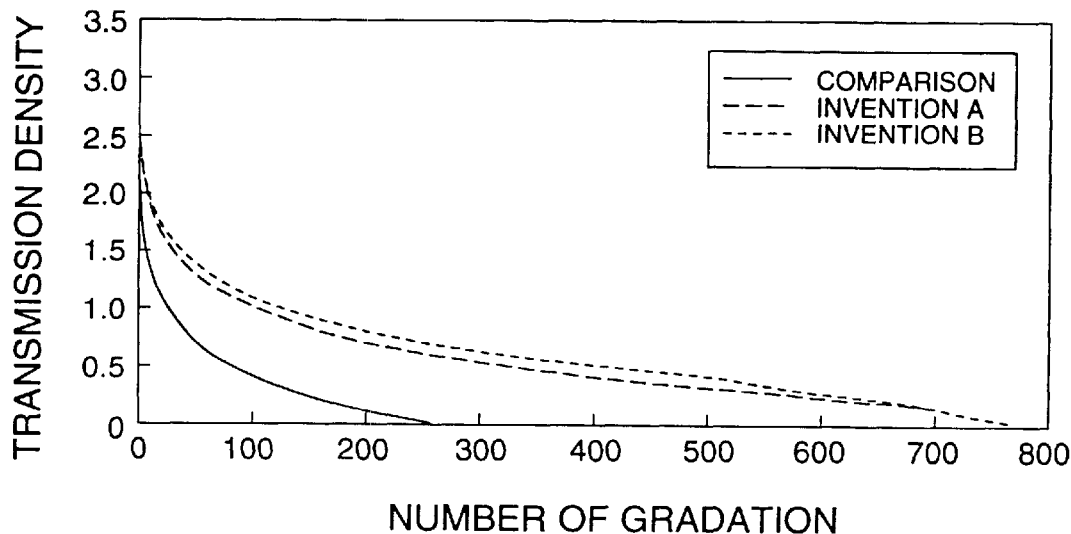
FIG. 1 shows a relationship between transmission density and number of gradation according to the invention.

Above object of the invention could be attained by the following constitution:

An image forming method comprising the following steps, a step for imagewise exposing a recording material having an image forming layer to a laser beam light based on an image information and making at least a part of an exposed portion of said image forming layer removable, a step for forming an image by removing said image forming layer which is removable, wherein a removable amount of said image forming layer by radiation of said laser beam light corresponding to one dot is variable in response to said image information.

An image forming method for forming an image having an gradation made by an area gradation comprising the following steps, a step for imagewise exposing a recording material having an image forming layer to a laser beam light based on an image information and making at least a part of an exposed portion of said image forming layer removable, a step for forming an image by receiving said image forming layer which is able to be removed by a receiving material, wherein said recording material is exposed to said laser beam light by varying a spot diameter of said laser beam light in response to said image information.

As a method for varying the spot diameter o f said laser beam light, is cited a method for changing a focus of said laser beam light, etc.

An image forming method for forming an image having an gradation made by an are a gradation comprising t he following steps, a step for imagewise exposing a recording material having an image forming layer to a laser beam light based on an image information and making at least a part of an exposed portion of said image forming layer removable, a step for forming an image by receiving said image forming layer which is removable by the receiving material, wherein said recording material is exposed to said laser beam light by varying a radiation energy of said laser beam light i n response to said image information.

In this invention, [imagewise exposing a recording material having an image forming layer to a laser beam light based on an image information and making at least a part of an exposed portion of said image forming layer removable, and forming an image by removing said image forming layer which is removable] does not mean forming an image by removing only dye performed in such a sublimation thermal transfer, but means forming an image by removing whole layer containing components constituting color. For example, are cited a method for melting an exposed portion of an image forming layer and making this portion removable, and a method for lowering an adhesion force between an exposed portion of support and an exposed portion of an image forming layer, that is, a method for making an exposed portion of an image forming layer removable by ablation, etc., but an usable method in the invention is not limited thereto. In cases where an image is formed by using these materials, a binary coding in which the image forming layer is removed or not is regarded as forming the image.

Regarding methods for removing the image forming layer which is removable, are cited a method for receiving the image forming layer which is removable by melting or ablation by the receiving material, a method for removing the image forming layer which is removable by suction and an air blast, but an usable method in the invention is not limited thereto.

In cases where the receiving material receives the image forming layer which is removable for the purpose of removing it, both the recording material and receiving material are available as a final image usable in the invention. Further, the image forming layer may react with the receiving material resulting in coloring. After exposing the material in which the receiving material and recording material are united into an integrated unit beforehand to the laser beam light, by peeling off the receiving material from the recording material, the image forming layer which is removable may be received by the receiving material. The receiving material and recording material are separated and superposed with each other before exposing and may be thereafter exposed.

The laser beam light used in the invention can be converted into heat by light-heat converting dye, and heat which is generated by a pigment which itself absorbs light resulting in generating heat can be used. The recording material in the invention is the material containing dye and pigment or their precursors which form the image.

<Recording Material>
<Support>

As a support, there is no limitation as far as the support is a transparent film. The support includes a resin film such as polyethyleneterephthalate, syndiostaticpolystyrene, acryl acid ester, methacryl acid ester, polybutyleneterephthalate, polyethylenenaphthalate, polycarbonate, polyacrylate, polyvinyl chloride, polyethylene, polypropylene, polystyrene, nylon, aromatic polyamide, polyether etherketone, polysulfone, polyether sulfone, polyimide or polyether imide, or a transparent support comprising a resin film in which the above mentioned two or more resins are laminated. Especially, polyethylene, polypropylene and polystyrene are preferably used.

(Image Forming Layer)

The image forming layer contains a coloring material or its precursor and a binder retaining the coloring material or its precursor.

The coloring material used in the invention is the coloring material which can absorb the same wavelength light of exposing light source, for examples, carbon black and graphite are preferably used because they can absorb wide wavelength region from ultraviolet region through visible region to infrared region.

As other coloring material, inorganic or organic pigment and dyestuff can be used singly, in combination of two kinds or three kinds.

As examples of the inorganic pigments, are cited titanium dioxide, carbon black, zinc oxide, Purssian blue, cadmium sulfide, iron oxide, and chromates of lead, zinc, barium and calcium. As examples of the organic pigments, are cited azo derivative, thioindigo derivative, anthraquinone derivative, anthoanthrone derivative, triphenodioxazine derivative, vat dyestuff pigment, phthalocyanine pigment (copper phthalocyanine and its derivative), and quinacridone pigment, etc. And as examples of the organic dyestuffs, are cited acidic dyestuff, direct dyestuff and dispersed dyestuff, etc.

In cases where the wavelength of exposing light source is in near infrared radiation, as near infrared ray absorbing agents, are preferably used organic compounds such as cyanine derivative, polymethine derivative, azulenium derivative, squalenium derivative, thiopyrylium derivative, naphthoquinone derivative, anthraquinone derivative, and organic metal complexes composed of phthalocyanine derivative, azo derivative, and thioamide derivative, concretely are cited the compounds described in JP-A Nos. 63-139191, 64-33547, 1-160683, 1-280750, 1-293342, 2-2074, 3-26593, 3-30991, 3-34891, 3-36093, 3-36094, 3-36095, 3-42281, 3-97589, and 3-103476.

As the coloring material which exhibits the effect of this invention effectively, metal atom containing particles are preferably used. In cases where the metal atom containing particles are used as the coloring material in the image forming layer of the image forming material according to the invention, improvement of sensitivity, resolution and stain in exposing area is more remarkable.

Hereon, the metal atom containing particles generally include metals such as iron, chromium, manganese, cobalt, nickel, copper, zinc, titanium, silver, aluminium, gold and platinum or compounds of their oxides, etc.

As the metal atom containing particles preferably used in the invention, are cited ferromagnetic ferric oxide powder particles, ferromagnetic metal powder particles, and cubic tabular powder particles, among them ferromagnetic metal powder particles are suitably used. Especially, in cases where the ablation is carried out, it is preferable to use the ferromagnetic metal powder particles.

The ferromagnetic ferric oxide powder particles include $\gamma$-$Fe_2O_3$, $Fe_3O_4$, and an intermediate ferric oxide thereof, $FeO_x$ ($1.33<x<1.50$).

Examples of the ferromagnetic metal powder particles include ferromagnetic metal powders such as Fe type, Co type, Fe—Al type, Fe—Al—Ni type, Fe—Al—Zn type, Fe—Al—Co type, Fe—Al—Ca type, Fe—Ni type, Fe—Ni—Al type, Fe—Ni—Co type, Fe—Ni—Zn type, Fe—Ni—Mn type, Fe—Ni—Si type, Fe—Ni—Si—Al—Mn type, Fe—Ni—Si—Al—Zn type, Fe—Ni—Si—Al—Co type, Fe—Al—Si type, Fe—Al—Zn type, Fe—Co—Ni—P type, Fe—Co—Al—Ca type, Ni—Co type, and magnetic metal powders whose principal components are Fe, Ni and Co. Of them, Fe type metal powders are preferable, and is cited Co containing iron oxides magnetic powders such as Co containing $\gamma$-$Fe_2O_3$, Co coating $\gamma$-$Fe_2O_3$, Co containing $Fe_3O_4$, Co coating $Fe_3O_4$, and Co containing magnetic $FeO_x$ (4/3<x<3/2).

In view of corrosion-resistance and dispersibility the preferred are Fe—Al type ferromagnetic metal powders including Fe—Al type, Fe—Al—Ca type, Fe—Al—Ni type, Fe—Al—Zn type, Fe—Al—Co type, Fe—Ni—Si—Al—Co type and Fe—Co—Al—Ca type. Of these powders, the preferable are ferromagnetic powder in which the content ratio of a Fe atom to an Al atom is 100:1 to 100:20 and the content ratio at 100 Å depth of a Fe atom to an Al atom is 30:70 to 70:30 measured through ESCA (electron spectroscopy for chemical analysis) or ferromagnetic powder containing at least one of Fe, Ni, Al, Si, Co and Ca in which the Fe content is 90 atom % or more, the Ni content is 1 to 10 atom %, the Al content is 0.1 to 5 atom %, the Si content is 0.1 to 5 atom %, the Co or Ca content (or the sum content of Co and Ca) is 0.1 to 13 atom %, and the content ratio by the number of atom at not more than 100 Å depth, Fe:Ni:Al:Si:(Co and/or Ca) is 100:(not more than 4):(10 to 60):(10 to 70):(20 to 80), measured through ESCA (electron spectroscopy for chemical analysis).

With respect to the shape of the ferromagnetic powder particles, the axial length is not more than 0.30 $\mu$m, and preferably not more than 0.20 $\mu$m. According to the above ferromagnetic powder particles, the surface property of the image forming layer is improved.

As a hexagonal tabular powder, is cited a hexagonal type ferrite such as barium ferrite and strontium ferrite. A part of iron element may be substituted by other atoms (Ti, Co, Zn, In, Mn, Ge, and Hb, etc.), and such ferrite magnetic substances are described in IEEE trans on MAG, pp. 18, 16 (1982). For example, the barium ferrite magnetic powder in which a part of iron is substituted by at least Co and Zn has an average particle size (height of a diagonal line of tabular plane of the hexagonal ferrite) of 400 to 900 Å, a plate ratio (length of a diagonal line of tabular plane of the hexagonal ferrite divided by thickness of plate) of 2.0 to 10.0. A part of Fe in the barium ferrite magnetic powder may be substituted by transition metals such as Ti, In, Mn, Cu, Ge and Sn, etc.

With respect to a method for producing cubic magnetic powder, for example, oxide and carbonate compounds of each element necessary for forming target barium ferrite are melted together with glass forming substance such as boric acid, thus obtained melted solution is cooled down rapidly so as to form glass, then this glass is heat-treated at a given temperature so that the crystal powder particles of the target barium ferrite are precipitated, finally glass composition is removed by heat-treatment. The above mentioned method is termed glass crystallization and there are other methods such as coprecipitation-incineration method, water-heat synthesis method, flux method, alkoxide method, and plasma-jet method, etc.

The content of the metal atom containing particles contained in the image forming layer is 50 to 99 wt % of the image forming layer composition, preferably 60 to 95 wt %.

With respect to the binder resin which is transferred to the receiving material by ablating the portions exposed to the laser beam light, any binder resin which can retain the coloring material or the metal atom containing particles is usable without any limitation.

Typical binder resins used in the invention are polyurethanes, polyesters, and vinyl chloride type resins such as vinyl chloride copolymers. Preferably, these resins contain repeated units having at least one polar group selected from —$SO_3M$, —$OSO_3M$, —COOM and —PO($OM_1$)$_2$, wherein M represents a hydrogen atom or an alkali metal atom, $M_1$ represents a hydrogen atom, an alkali metal atom or an alkyl group. These polar groups have a function to enhance dispersibility of magnetic powder particles and are contained in the resin at a rate ranging from 0.1 to 8.0 mol %, preferably from 0.2 to 6.0 mol %.

The binders can be used either singly or in combination of two or more kinds; when these are used in combination, the ratio of polyurethane and/or polyester to vinyl chloride type resin is within the range of usually 90:10 to 10:90, preferably 70:30 to 30:70 in weight ratio.

The polar group containing polyvinyl chloride is prepared by addition reaction of a hydroxy group containing resin such as vinyl chloride-vinyl alcohol copolymer with a polar group such as $ClCH_2CH_2SO_3M$, $ClCH_2CH_2OSO_3M$, $ClCH_2COOM$ or $ClCH_2P(=O)(OM_1)_2$ or a chlorine atom containing compound.

The polar group containing polyvinyl chloride resin is prepared by polymerization of a reactive monomer having an unsaturated bond in which are introduced repeated units containing polar groups in the presence of a radical initiator such as benzoyl peroxide or azobisisobutylonitrile, a redox initiator or a cation polymerization initiator in an autoclave. The monomer to incorporate a sulfonic acid or its salt includes an unsaturated hydrocarbon sulfonic acid such as vinyl sulfonic acid, allyl sulfonic acid, methacryl sulfonic acid or p-styrene sulfonic acid and their salts. In order to incorporate a carboxylic acid or its salt, for example, (meth) acrylic acid or maleic acid may be used, and in order to incorporate a phosphoric acid or its salt, for example, (meth)acryl-2-phosphate may be used.

Further, in order to improve thermal stability of a binder resin, an epoxy group is preferably incorporated in a vinyl chloride copolymer. The content of a unit having an epoxy group in the copolymer is 1 to 30 mol %, preferably 1 to 20 mol %. The monomer to incorporate epoxy is preferably glycidyl acrylate.

The polar group containing polyester is prepared by dehydration condensation reaction of a polyol with a polybasic acid having a polar group. The polybasic acid having a polar group includes 5-sulfoisophthalic acid, 2-sulfoisophthalic acid, 4-sulfoisophthalic acid, 3-sulfophthalic acid, 5-sulfoisophthalic acid dialkyl, 2-sulfoisophthalic acid dialkyl, 4-sulfoisophthalic acid dialkyl and 3-sulfophthalic acid dialkyl, or a metal salts thereof, and the polyol includes trimethylolpropane, hexane triol, glycerin, trimethylolethane, neopentyl glycol, pentaerythritol, ethylene glycol, propylene glycol, 1,3-butane diol, 1,4-butane diol, 1,6-hexane diol, diethylene glycol and cyclohexane dimethanol.

The polar group containing polyurethane is prepared by reaction of a polyol with a polyisocyanate. The polyol includes polyol polyester prepared by reaction of polyol with a polybasic acid having a polar group. The polyisocyanate includes diphenylmethane-4,4'-diisocyanate, 2,4-tolylene diisocyanate, 2,6-tolylene diisocyanate, 1,5-naphthalene diisocyanate and lydin isocyanate methylester. The other preparation method of the polar group containing polyurethane includes an addition reaction of polyurethane having a hydroxy group with a compound containing a polar group and a chlorine atom such as $ClCH_2CH_2SO_3M$, $ClCH_2CH_2OSO_3M$, $ClCH_2COOM$ or $ClCH_2P(=O)(OM_1)_2$.

Besides the above binder resins, the binder resins include vinyl chloride resins such as vinyl chloride-vinyl acetate copolymers, polyolefins such as butadien-acrylonitrile copolymers, polyvinyl acetals such as polyvinyl butyrals, cellulose derivatives including nitrocellulose, styrene resins such as styrene-butadiene copolymers, acryl resins such as polymethylmethacrylate resins, polyamide resins, phenolic resins, epoxy resins, and phenoxy resins. These binder resins can be used in combination with the above mentioned binder resins, and in cases where these binder resins are used in combination, the content of these binder resins is preferably not more than 20 wt % of whole binder resins.

The content of the binder resins in the image forming layer is 1 to 50 wt % in composition of the image forming layer components, preferably 5 to 40 wt %.

The image forming layer may contain additives such as durability improving agents, dispersing agents, antistatic agents, fillers, hardeners, etc. as long as the effects of the invention are not inhibited.

The durability improving agents include polyisocyanate, etc. The dispersing agents include fatty acids having 12 to 18 carbon atoms such as lauric acid and stearic acid, their amides, their alkali metal salts, and their alkaline earth metal salts, and include polyalkyleneoxidealkylphosphate salts, lecithin, trialkylpolyolefinoxyquaternary ammonium salts, and azo compounds containing carboxy group and sulfone group. The antistatic agents include a cationic surfactant, an anionic surfactant, a nonionic surfactant, a polymeric antistatic agent and conductive fine particles and compounds described on pages 875 and 876, 11290 Chemicals, edited by Kagaku Kogyo Nippo Co. Ltd.

The fillers include inorganic fillers such as carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, silica stone, tripoli, diatomaceous earth, dolomite, and organic fillers such as polyethylene resin particles, fluorine-containing resin particles, guanamine resin particles, acryl resin particles, silicone resin particles, and melamine resin particles. These substances may serve as a releasing agent. The adding amount of these inorganic or organic resin particles is preferably 0.1 to 70 wt % depending on the specific gravity of these substances.

Hardeners can be used in the image forming material in the image forming method according to the invention. The hardeners are used without any limitations as long as they can harden the image forming layer, and include, for example, polyisocyanates which are used in preparing polyurethanes for the binder described above.

The hardeners harden the image forming layer and give the image having high durability, and stains at the portions where ablation occurs can be reduced. Further, since the hardeners can improve the durability of the image forming layer to an organic solvent, an image protective layer can be coated on the image forming layer without any damage even if the organic solvent is used when the image protective layer being coated. As a result, it is possible to provide the image forming material which is more excellent in the durability than an image forming material comprising the image protective layer containing a water soluble or water dispersible resin. On the other hand, since there may be the possibility that the resolution power is lowered, addition amount of the hardeners is preferably adjusted.

The addition amount of these additives is 0 to 20 wt %, preferably 0 to 15 wt %.

The thickness of the image forming layer is 0.05 to 5.0 $\mu$M. preferably 0.1 to 3.0 $\mu$m. The image forming layer can be composed of mono-layer and multi-layers in which the components of each layer are different. In cases where the image forming layer is composed of multi-layers, it is preferable to contain more amount of the coloring agent capable of absorbing the same wavelength light of the exposing light source in a layer closer to the support. Further, it may be possible to contain the coloring material capable of absorbing the wavelength light other than the wavelength light of exposing light source in a layer farther from the support.

The image forming layer is formed as follows. Paint is prepared by kneading, for example, coloring material, binder resin, if necessary, durability improving agent, dispersing agent, antistatic agent, filler, hardener, etc. and solvent, and then the paint is diluted, coated on the support and dried.

The solvent includes alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofuran, dioxane), halogenated solvents (chloroform, dichlorobenzene), amide type solvents (dimethylformamide, N-methylpyrrolidone). As the kneaders for an image forming layer composition, suitable examples include two-roll mills, three-roll mills, ball mills, pebble mills, coball mills, tron mills, sand mills, sand grinders, sqegvari attritor, high-speed impeller dispersers, high-speed stone mills, high-speed impact mills, dispersers, high-speed mixers, homogenizers, supersonic dispersers, open kneaders, and continuous kneaders.

In order to coat an image forming layer on a support, coating is carried out by an extrusion method and then dried. Calender treatment may be carried out in order to optionally orient the magnetic particles and make the surface of the image forming layer uniform. Especially, to orient the magnetic particles is preferable in order to obtain the image having high resolution power because controlling an aggregation power in the layer is easier.

When the image protective layer is coated on the image forming layer, each layer may be coated separately, and the layers may be multilayer coated by wet-on wet coating method. In carrying out wet-on-wet multilayer coating, a combination of an extrusion coater with a reverse roll, a gravure roll, an air doctor coater, a blade coater, an air knife coater, a squeeze coater, a dip coater, a bar coater, a transfer roll coater, a kiss coater, a cast coater or a spray coater can be used.

In carrying out wet-on-wet multilayer coating, since an upper layer is coated on an under layer while the under layer is wet, the adhesion between upper and under layers is enhanced.

The calender treatment in the invention is the treatment in which the image forming layer is coated on the support, thereafter thus obtained material is usually passed through between a very smooth nip roller having diameter of 1 to 100 cm and a roller capable of heating facing the above nip roller. By calendering treatment, reducing voids which occur during coating and drying processes of the image forming layer coating solution and enhancing density of the image forming layer are attained.

With respect to the condition of calendering, in order to lower void in the image forming layer effectively, usually as a line pressure, a nip pressure of 2 to 100 kg/cm, preferably 5 to 50 kg/cm is applied to the image forming layer. Heating temperature is usually 40 to 200° C., preferably 50 to 120° C., but since the most suitable heating temperature depends on the transport speed, the heating temperature is so set that the maximum momentary temperature of the image forming layer heated at the calender treatment is 30 to 100° C. When the line pressure and maximum momentary temperature are lower than the above mentioned range, few effect of the present invention is obtained, and when these are higher than the above mentioned range, deformation and crack of the support of the image forming material and the image forming layer unpreferably occur. The calender treatment is preferably carried out just after the coating of the image forming layer in spite of existence of hardening treatment of the image forming layer, but if necessary, the calender treatment may be carried out after the image protective layer is coated.

With respect to a means to transferring the image forming layer to the receiving material by heat melting adhesion in the invention, heat active image forming layer is provided. The heat active image forming layer is the layer which is concerned in image forming and is the layer capable of being heat active by exposing the image forming material to a high density energy light, and the exposed portion of said layer is adhered tightly to the image forming layer by cooling said layer rapidly. The heat active image forming layer comprises a layer which consists mainly of a resin having lower softening temperature than the support. As the examples of the resins, are cited styrene type resin, polyvinylacetal type resin, acryl type resin, polyolefin type resin, polyester type resin, vinylchloride type resin or the compound described in Japanese Patent Publication to Public Inspection under PCT Application No. 5-503899.

(Image Protective Layer)

In this invention, if necessary, an image protective layer is coated on the image forming layer and its thickness is preferably 0.03 to 1.0 $\mu$m, more preferably 0.05 to 0.5 $\mu$m. With thinner layer, image durability is not improved so much, and with thicker layer, sensitivity and resolution are lowered. The image protective layer mainly consists of resin binder and fine particles.

The binder resins are used without any limitation as long as they can retain the fine particles. As the examples of the binder resins, are cited polyurethane, polyester, vinylchloride type resin such as vinylchloride type copolymer, vinylchloride type resin such as vinylchloride-vinylacetate copolymer, polyolefin type resin such as butadiene-acrylonitrile copolymer, polyvinylacetal type resin such as polyvinylbutyral, cellulose type resin such as nitrocellulose, styrene type resin such as styrene-butadiene copolymer, acryl type resin such as polymethylmethacrylate, polyamide, phenol resin, epoxy resin, phenoxy resin, acetal type resins such as polyvinylbutyral, polyvinylacetoacetal and polyvinylformal, water-soluble resins such as polyvinylalcohol and gelatin. These may be used singly or in combination of two or more kinds.

The content of the binder resin in the image protective layer is 10 to 99.5 wt % in composition of the image protective layer components, preferably 40 to 98 wt %.

It is preferred to add a hardener such as polyisocyanate to enhance the durability of the image protective layer.

When the image protective layer is hardened, it is preferred to select binders having functional groups in their molecules to react with hardeners to form cross linkage. Concretely, when isocyanate type hardeners are used as a hardening agent, phenoxy type resin, epoxy type resin, cellulose type resin, acetal type resin, acryl type resin, urethane type resin, vinylchloride type resin, and polyester type resin are preferably used.

The fine particles include inorganic fillers such as carbon black, graphite, $TiO_2$, $BaSO_4$, $ZnS$, $MgCO_3$, $CaCO_3$, $ZnO$, $CaO$, $WS_2$, $MoS_2$, $MgO$, $SnO_2$, $Al_2O_3$, $\alpha$-$Fe_2O_3$, $\alpha$-$FeOOH$, $SiC$, $CeO_2$, $BN$, $SiN$, $MoC$, $BC$, $WC$, titanium carbide, corundum, artificial diamond, garnet, silica stone, tripoli, diatomaceous earth, dolomite, and organic fillers such as polyethylene resin particles, fluorine-containing resin particles, guanamine resin particles, acryl resin particles, silicone resin particles, and melamine resin particles. These substances may serve as a releasing agent.

In the invention, the fine particles having narrow and uniform particle distribution are preferred. Concretely, silicon resin fine particle (trade name of Tospar, produced by Toshiba Silicon Co., Ltd.), cross linkage forming acryl fine powder MR series, cross linkage forming polystyrene fine powder SGP series, and acryl super fine powder MP series (produced by Soken Kagaku Co., Ltd.) can be used.

An average diameter (r) of the fine particles used in the invention is preferably 0.3 to 20 $\mu$m, more preferably 0.8 to 4.5 $\mu$m. With smaller particles, sensitivity and fog deteriorate, and with larger particles, image durability deteriorates.

Addition amount of the fine particles used in the invention per unit area is 5 to 150 mg/m$^2$, preferably 10 to 100 mg/m$^2$. With less amount, sensitivity and fog deteriorate, and with more amount, resolution deteriorates.

In this invention, when the surface of the fine particles has functional groups capable of forming polymerization, the adhesion force between the image forming layer and the fine particles is enhanced when hardening the image forming layer so that the image durability is also enhanced. Concretely, FX-GSZ-07 (produced by Nihon Syokubai Co., Ltd.) is employed.

The smooster value of the surface of the image protective layer facing the receiving material according to the invention is 5 to 200 mmHg at 23° C., 55% R.H., preferably 10 to 100 mmHg. With the smaller smooster value, fog deteriorates, with the larger smooster value, resolution at the exposure deteriorates. The smooster value can be adjusted to a desirable value, for example, by roughening by sandblast method or adding fine particles.

(Image Receiving Material)

The image receiving material according to the invention can receive the portion of the image forming layer which is released by lowering the adhesion force between the support and the image forming layer and the melted portion of the image forming layer by exposing the image forming layer to a high density energy light. The exposed portion of the image forming layer is transferred to the image receiving material by peeling off the image receiving material from the support retaining the image forming layer. The image receiving material is mainly composed of a resin, and if necessary, the smooster value of the surface of the image receiving material contacting with the image protective layer or the image forming layer (in cases where there is no image protective layer) is preferably adjusted to 5 to 200 mmHg at 23° C., 55% R.H. by adding additives such as fine particles in the image receiving material, preferably 20 to 100 mmHg at 23° C., 55% R.H. By roughening both surfaces of the image protective layer or the image forming layer (in cases where there is no image protective layer) and the image receiving material, enhancement of resolution and lowering of exposing light energy are possible.

The smooster value of the image receiving material can be adjusted to a desirable value in the way in which that of the image protective layer is adjusted as mentioned above.

In later mentioned image forming method according to the invention, as a support for the image receiving material receiving the image peeled off after exposing, can be used the resin films such the above mentioned support as used for the image forming material. A receiving layer capable of receiving the image forming layer which is exposed to a high density of energy light can be coated on the resin film.

As a base material for the support of the image receiving material, is cited synthetic paper (consisting mainly of polypropylene), concretely, trade name of Upo produced by Oji Yuka Kakou Co., Ltd., various grades of trade name of Peach Coat produced by Nisshinbo Co., Ltd., or W-900 E produced by Diafoil Hoechst are preferably used.

The base material composed of resin in the invention is oriented in the sheet or film form and heat-set in view of dimensional stability. It is possible to select the base material having microvoids or having no microvoid depending on the purpose, concretely, W-400 produced by Diafoil Hoechst is preferably used.

Base paper for the support for the image receiving material in the invention is preferably a pulp paper prepared from natural pulp, synthetic pulp, or a mixture thereof, and more preferably paper prepared from a tree pulp. Paper is prepared through a long wire papering machine, and after the preparing, calendering is preferably carried out using a machine calender, super calender or heat calender for improving smoothness. The base paper coated with a resin layer containing pigment is preferably used for the purpose of enhancing the smoothness. As concrete base papers, are cited wood free paper, art paper, coat paper, single-sided glossy paper, impregnated paper and paper board, etc.

Paper has preferably a Beck smoothness of 50 seconds or more, more preferably 100 seconds or more, and still more preferably 200 seconds or more, to obtain smoothness when a laminated layer composed of a polypropylene or polyolefin containing white fine particles described later is provided. The paper thickness is not specifically limited, but is preferably 30 to 800 $\mu$m, and more preferably 50 to 500 $\mu$m.

The base paper may optionally contain a sizing agent, a fixing agent, an enhancing agent, fillers, an antistatic agent, a dye, pigment, a brightening agent, an antioxidant and an antiabrasion agent.

The base material is preferably highly transparent, when used for a transparent original of overhead projector or seal adhered to glass. When obtaining a reflective image, white pigment such as titanium oxide, zinc oxide, silica, barium sulfate, magnesium carbonate, calcium carbonate, talc and clay may be added to a layer constituting the base material for the purpose of improving image sharpness.

The thickness of the above mentioned base material is usually 20 to 1,000 $\mu$m, preferably 50 to 500 $\mu$m, and optionally selected from this range.

As the second embodiment of the image receiving material, is cited polypropylene sheet, or in cases where there is the image forming layer or the image protective layer of the image recording material, is cited polypropylene resin layer which is obtained by extrusion-coating on the image forming layer or the image protective layer, or is cited polypropylene resin layer which is obtained by coating and drying a solution containing polypropylene resin on the image forming layer or the image protective layer. The polypropylene resin layer is component of which main composition is polypropylene, and polypropylene content is not less than 50 wt % of total weight of whole resin components, and other resin components are, for example, the mixture of polyethylenepolybutane, polystyrene, ethylene-propylene copolymer, and ethylene-vinylacetate copolymer. Further, chlorinated polyolefin (e.g. chlorinated polyethylene), modified polyolefin (e.g. chemically modified polyethylene, chemically modified polypropylene) are included. The polypropylene may be a homopolymer of propylene and a copolymer containing other commoner such as ethylene, etc.

As to forming directly the image receiving material on the image recording material, the above mentioned raw material dissolved in solvent or dispersed in a latex form is coated by blade coater, roll coater, bar coater, curtain coater, gravure coater and laminated by extrusion using hot melt, and pasting a cushion layer film is applicable.

In the case of adjoining the image receiving material over the image protective layer (hereinafter, explanation will be given in cases where the image recording material has the image protective layer, and the image protective layer will be replaced by the image forming layer in cases where the image recording material does not have the image protective layer), if the image receiving material itself can function as a support, the image receiving material forming resin is dissolved in solvent and coated and dried so as to form the image receiving material as well as forming the image protective layer. In cases where the resin film which can be used as a support is used as the image receiving material, if the film has heat seal property like polypropylene, the image protective layer and the film are laminated and treated with heat and pressure using heat roll or hot stamp so as to obtain the image receiving material. If the film does not have heat seal property, the film is laminated by providing an adhesion layer on the image protective layer. That is, the resin film is laminated after the adhesion layer forming composition is coated on the image protective layer and dried, or after the adhesion layer forming composition is coated on the resin film and dried, or after the adhesion layer forming composition is heat-melted and laminated by extrusion, the adhesion layer side is superposed on the image protective layer and pasted with heat and pressure using heat roll or hot stamp, so as to obtain the image receiving material. With respect to a heat treatment, it is carried out by transferring the material and using the heat roll, at the temperature of room temperature to 180° C., preferably 30 to 160° C., at the pressure of 0.1 to 20 kg/cm, preferably 0.5 to 10 kg/cm, at the speed of 1 to 200 mm/sec., preferably 5 to 200 mm/sec. By using the hot stamp, the heat treatment is carried out at the temperature of room temperature to 180° C., preferably 30 to 150° C., at the pressure of 0.05 to 10 kg/cm, preferably 0.5 to 5 kg/cm, and heating time is 0.1 to 50 sec. preferably 0.5 to 20 sec.

In the invention, if the peeling strength between the image receiving material and the image forming layer or the image protective layer is 5 to 50 gf/cm according to the 180 degree peeling method of JIS C 2107 (JIS Z 0237), sufficient density is obtained, and the remaining ratio of the image forming layer in the exposed portion on the support is fewer after peeling off the image receiving material, and an image with high resolution is obtained and peeling development is easier.

The peeling strength can be established by adjusting the pressure or heat pressure appropriately, when the image receiving material and the image forming layer or the image protective layer are pasted together and adhered. The image receiving material may be provided by directly coating a resin which itself functions as a support or by extruding the aforesaid resin using hot melt on the image forming layer. A adhesion layer or sticking layer is provided on the above mentioned resin film by coating or hot melt extrusion method, then the adhesion layer or sticking layer is pasted with the image forming layer or the image protective layer, thereafter the peeling strength of the image receiving material is adjusted. The pasting may be carried out before or after exposing.

The adhesion layer or the sticking layer referred hereon has itself adhesiveness or stickiness and the adhesiveness and the stickiness exhibit the effect by heat and pressure, for examples, a resin having low softening point, an adhesion giving agent and a heat solvent are optionally selected and used so as to form the adhesion layer or the sticking layer.

As the resins having low softening point, are cited ethylene copolymer such as ethylene-vinylacetate, ethylene-ethylacrylate; polystyrene type resin such as styrene-butadiene, styrene-isoprene, styrene-ethylene-butylene; polyester type resin; polyolefin type resin such as polyethylene, polypropylene; polyvinylether type resin; acryl type resin such as polybutylmethacrylate; ionomer type resin; cellulose type resin; epoxy type resin; vinylchloride type resin such as vinylchloride-vinylacetate copolymer. As the adhesion giving agents, are cited unmodified or modified rosin derivatives such as rosin, hydrogen treated rosin, rosin maleic acid, polymerized rosin and rosin phenol, terpene and petroleum resin and their modified substances. The heat solvent is solid at room temperature and liquidized or softened by heating reversibly. As the examples of heat solvents, are cited monomeric molecule compounds such as terpineol, menthol, acetamide, benzamide, coumarin, benzyl cinnamate, diphenylether, crownether, camphor, p-methylacetophenone, vanillin, dimethoxybenzaldehyde, p-benzylbiphenyl, stilbene, margaric acid, eicosanol, cetyl palmitate, stearic acid amide, behenyl amine; and waxes such as bees wax, candelilla wax, paraffin wax, ester wax, montan wax, carnauba wax, amide wax, polyethylene wax, micro crystalline wax; rosin derivatives such as ester gum, rosin maleic acid resin, rosin phenol resin; high molecular compounds such as phenol resin, ketone resin, epoxy resin, diarylphthalate resin, terpene type hydrocarbon resin, cyclopentadiene resin, polyolefin type resin, polycaprolactone type resin, polyolefinoxide including polyethyleneglycol, poly propyleneglycol.

The thickness of the adhesion layer or the sticking layer is 0.1 to 40 $\mu$m, preferably 0.3 to 30 $\mu$m, and total thickness of whole image receiving material including the support is 0.1 to 200 $\mu$m, preferably 0.5 to 100 $\mu$m.

As solvents used for making coating solution of the above mentioned components, are cited water, alcohols (ethanol, propanol), cellosolves (methyl cellosolve, ethyl cellosolve), aromatic solvents (toluene, xylene, chlorobenzene), ketones (acetone, methylethyl ketone), esters (ethylacetate, butylacetate), ethers (tetrahydrofurane, dioxane), halogenated solvents (chloroform, trichloroethylene), amide type solvents (dimethylformamide, N-methylpyrrolidone), dimethylsulfoxide. The above mentioned components can be extruded by melting them with hot melt so as to form layer.

When the image receiving material is processed with pressure or heat-pressure, the image receiving material can be used without any limitations so long as the pressure or heat-pressure can be applied air-tightly. The pressure is applied by means of a pressure roller or a stamper, and the heat-pressure is applied by means of a thermal head, a heat roller or a hot stamp.

(Image Forming Method)

The image forming method according to the invention comprises the steps of exposing the image forming layer to a high density energy light whereby the adhesion force between the support and the exposed portion of the image forming layer is reduced, then removing the image forming layer in the exposed portion so as to obtain the image.

In the invention an image can be obtained by the following two image forming methods using the above described image forming material, and two methods each will be explained below.

(Image Forming Method 1)

The image forming method 1 comprises the steps of exposing the image forming layer to a high density energy light, whereby the adhesion force between the support and the exposed portion of the image forming layer is reduced, then removing whole image forming layer (hereinafter referred to as ablation portion), whose adhesion force with said support is reduced, together with the image protective layer in cases where there is the image protective layer, by using a means capable of removing the ablation portion so as to obtain the image.

With respect to the image exposure, in order to obtain a high resolving power, the light source is preferably an electromagnetic wave, a visible light or an infrared light capable of making the energy spots smaller. Such a high density energy light includes, for example, a laser light. The energy applied is optionally adjusted by selecting an exposure distance, an exposure time or an exposure strength according to kinds of image forming materials used.

When the laser light is used, the light can be condensed in the beam form and a latent image is formed using a scanning exposure according to an image. The laser light is easy to condense the exposure spots in small size and therefore, a highly resolved image can be obtained.

The laser light used in the invention is well known. The laser source includes solid lasers such as a ruby laser, a YAG laser, a glass laser, a gas laser such as a He—Ne laser, a Ar laser, a Kr laser, a $CO_2$ laser, a CO laser, a He—Cd laser, a $N_2$ laser, an eximer laser, an semiconductor laser such as a InGaP laser, a AlGaAs laser, a GaAsP laser, a InGaAs laser, a InAsP laser, $CdSnP_2$ laser or a GaSb laser, a chemical laser, and a dye laser. Of these laser light sources, a laser having a 600 to 1200 nm wavelength is preferable in sensitivity in order to occur ablation in the exposed portions, since a light energy can be effectively converted to a heat energy.

The exposure using a high density energy light can be carried out from both the support side and the image forming layer side.

(Image Forming Method 2)

The image forming method 2, by using the image forming material in which the image receiving material is previously laminated on the above described image forming layer or image protective layer, comprises the steps of exposing the image forming layer to a high density energy light, whereby the adhesion force between the support and the exposed portion of the image forming layer is reduced, peeling off the image receiving material from the support so that the exposed portion of the image forming layer can be transferred to the image receiving material. The peeling force necessary for peeling off the image protective layer of the image forming material from the image receiving material is preferably 5 to 50 gf/cm according to the 180 degree peeling method of JIS C 2107 (JIS Z 0237), with the peeling strength of not more than 5 gf/cm, unnecessary peeling sometimes occurs before exposure, and with the peeling strength of not less than 50 gf/cm, there may be such fear that large size of apparatus is necessary for peeling off a large size of the image forming material after exposing it, because a larger peeling force is needed to peel off large size of said image forming material, or such fear that a dimentional change including a stretch of the support retaining the image forming layer and the support of the image receiving material occurs.

The imagewise exposure using a light energy is preferably carried out from the support side in this method. The imagewise exposure is preferably carried out to reduce or lose only the adhesion force between the support and the coloring agent containing layer without destroying the exposed portions of coloring agent containing layer, because the exposed portions of the image forming layer can be uniformly transferred to the image receiving layer.

The thickness of the image receiving material is preferably 5 to 300 µm, more preferably 10 to 150 µm. That is common to both two image forming methods mentioned above.

Various methods for peeling the image receiving material can be employed as long as they have no adverse affection on image forming. The peeling method includes a method of peeling the image receiving material from the image forming material using a peeling plate or a peeling roller with a fixed peeling angle and a method of manually peeling the image receiving material from the image forming material without fixing a peeling angle.

In this invention, in response to the image information, by radiation of the laser beam light corresponding to one dot in a fixed time, a removable amount of the image forming layer can be variable. For example, by radiation of the laser beam light corresponding to one dot in a fixed time, varying an average diameter of dots of the image forming layer which is removable, the removable amount of the image forming layer is varied. With respect to the methods for varying the average diameter of dots of the image forming layer which is removable in response to the image information, are cited a method for varying a laser spot diameter of the laser beam light on the image forming layer in response to the image information, and a method for varying a radiation energy of the laser beam light in response to the image information, etc., but an usable method is not limited thereto. As other methods for varying the average diameter of dots of the removable image forming layer, are cited a method for varying the number of the laser beam light sources radiated in response to the image information by placing plural laser light sources radiating the laser beam light nearly at the same position, and a method for varying the kind of the laser beam light sources radiated in response to the image information by placing plural laser light sources each having different laser spot diameter or different radiation energy nearly at the same position. With respect to the methods for varying a laser spot diameter of the laser beam light on the image forming layer, are cited a method varying a focus of the laser beam light and a method for varying a laser spot diameter by employing a diaphragm.

Next, in the image forming method according to the invention, a means to form an image by varying a laser spot diameter of a laser beam light will be explained. The laser spot diameter in the invention is the diameter (long diameter, short diameter) of an exposing area of the laser beam light when the laser beam light generated from a laser generator is exposed to the image forming material. As a means to vary the laser spot diameter, is cited varying a focus position of the laser beam light. The method for exposing stably a condensed laser beam light generated from the laser generator equipped on a moving stand which moves by following the displacement measured by a displacement sensor is described in Kojiki Memory Sogogijutushusei (Light Magnetic Memory Collective Technique) issued by Science Forum and Japanese Utility Model Publication No. 2554332. However, this means is the means to stabilize the laser spot diameter exposed to the image forming material and is different from the means employed in the present invention to vary the laser spot diameter (radiated area) so as to increase number of an area gradation.

Usually, in the case of expressing an image according to the area gradation, an input image is treated with binary coding technique and the image information having treated binary coding density information is recorded by on/off of the laser beam light. In this invention, the input image data are treated with ternary coding or more coding and converted into the image formation having the ternary coding or more coding density information, and based on this image information, by varying the laser spot diameter and radiation energy, removable amount of the image forming layer becomes variable by radiating the laser beam light corresponding to one dot, resulting in being able to increase gradation. For example, in the case of the image information having ternary coding density information, are cited a method for varying the average diameter of dots of the removable image forming layer by converting the radiation energy of the laser beam light into [strong], [weak], [non-radiation] in response to the density information, and a method for varying the average diameter of dots of the removable image forming layer by converting the laser spot diameter of the laser beam light into [large], [small], [non-radiation] in response to the density information. The means to convert the input image data into ternary coding or more coding is disclosed in JP-A No. 1-254071. In cases where minimum density is obtained in the recording material and maximum density is obtained in the receiving material, that is, in cases where an exposed area ratio is maximum when forming an image, the area ratio can be taken to be 100%, or it is allowed to leave an unexposed portion in an image forming region in which the maximum density can be obtained without the area ratio being taken to be 100%. In cases where the unexposed portion is left, the area of the image forming region is preferably 30 to 100 cm$^2$. With respect to preparing the unexposed portion, for example, when forming an image composed of 5000 dpi (dot per inch), is cited a method for preparing one unexposed dot per one thousand dots, etc. An existing ratio of the unexposed portion is preferably 0.001 to 5%, especially preferably 0.01 to 1%. An arrangement of the unexposed portion is arbitrary, but is preferably regular. Further, in the recording material, a metal evaporation-deposit layer may be provided on the image forming layer. In this case, a transmission density of the image forming layer is preferably 0.5 to 2.5 and that of the metal evaporation-deposit layer is preferably 0.5 to 3.0. As methods for forming the metal evaporation-deposit layer, are cited known methods such as a vacuum evaporation-deposit method, an ion plating method and a spattering method, etc., and as the metal evaporation-deposit thin layer, a single crystal of a metal layer or a poly crystal of a metal layer can be provided. As examples of the metals evaporated, are cited alminium, zink, antimony, indium, selenium, tin, tantalum, chromium, lead, gold, silver, platinum, nickel, niobium, germanium, silicon, molybdenum, manganese, tungsten and palladium, etc. These metals can be used singly or in combination of two kinds or more. A thickness of the metal evaporation-deposit thin layer differs depending on kind of the metal, an evaporation-deposit condition and flatness of an under layer of the metal evaporation-deposit thin layer, but it is 50 to 2000 Å, preferably 500 to 1500 Å. In this case, it is preferred to observe an image from back side because there exists a reflection on the evaporation-deposit layer side caused by a metallic luster. Further, a protective layer may be coated on the evaporation-deposit layer.

EXAMPLES

The invention is hereunder described with examples, but the scope of the invention is by no means limited to them. In the examples, all "parts" are parts by weight, unless otherwise specified.

Example 1

<Image Forming Material>

The inventive image forming material was prepared using a support, an image forming layer, and an image receiving material.

-Support-

Transparent polyethylene terephthalate film having thickness of 180 µm is subjected to corona discharge on an image forming layer side.

Image Forming Layer

Image Forming Layer 1

The following composition was kneaded and dispersed with an open pressure kneader to obtain an image forming layer coating solution containing magnetic powder. The resulting coating solution was coated on a support by an extrusion coating method, subjected to magnetic orientation before drying, dried and subjected to calendering according to the following condition. After then, hardening reaction was completed by heat treating at 60° C. for 72 hours so as to obtain a black pigment layer. The transmission density of the black pigment layer was adjusted to be 3.4 after calendering treatment.

(Calender treatment)

The image forming layer was treated with heat and pressure by passing it between a calender roll comprising a metal roll having diameter of 300 mm wound around by polyimide resin having thickness of 3 mm and a metal roll having diameter of 300 mm heated at 80° C. facing the calender roll, at line pressure of 10 kg/cm and at transport speed of 10 m/min. (Composition of black pigment layer forming coating solution)

| | |
|---|---|
| Fe-Al ferromagnetic metal powder (serving as coloring agent and metal-containing powder) (Fe:Al ratio in number of atoms:overall average = 100:4, surface layer = 50:50, average major axial length = 0.14 µm) | 100 parts |
| Potassiumsulfonate-containing vinyl chloride resin (MR110 made by Nippon Zeon Co., Ltd.) | 10 parts |
| Sodiumsulfonate-containing polyurethane resin (UR8700 made by Toyobo Co., Ltd.) | 10 parts |
| α-Alumina (average particle size: 0.15 µm) | 8 parts |
| Stearic acid | 1 part |
| Polyisocyanate (Coronate L made by Nihon Polyurethane Kogyo Co., Ltd.) | 5 parts |
| Cyclohexanone | 100 parts |
| Methyl ethyl ketone | 100 parts |
| Toluene | 100 parts |

-Image protective layer-

The composition consisting of the following resin binder and fine particles was coated on the above described image forming layer by wire bar coating so that the thickness after drying is to be 0.3 µm.

| | |
|---|---|
| Binder resin; phenoxy resin (UCAR phenoxy resin PKHH made by Union Carbide Co., Ltd) | 3.5 parts |
| Hardener; diphenylmethane-4,4'-diisoicyanate (Millionate MT made by Nihon Polyurethane) | 1.5 parts |
| Methyl ethyl ketone | 95 parts |

Fine particles; silicon resin fine particle 15 mg/m² (average particle size: 0.5 µm)
(Tospar 120 made by Toshiba Silicon Co., Ltd.)

Image Receiving Material

An image receiving material was obtained by coating a image receiving layer comprising the following composition on a white polyethyleneterephthalate film (W-400; made by Diafoil Hoechst Co., Ltd.) having thickness of 38 µm so that a coating amount is to be 1.1 g/M².

| | |
|---|---|
| Polyurethane resin (solid part; 20.9%) (Nipporan 3116; made by Nihon polyurethane Co., Ltd.) | 30 parts |
| Methyl ethyl ketone | 35 parts |
| Toluene | 35 parts |

The image forming material having the above mentioned support thereon the image forming layer and the image protective layer coated in this order was superposed to face the image receiving material, thereafter both materials were adhered by a compression roller (transport speed: 30 mm/second, applied pressure: 3.0 kg/cm) so as to obtain one united sample.

<Image Forming Method>

1. Comparison

The image forming material was loaded on a dram having diameter of 10 inches by suction and the surface of the image forming material was focused using a semiconductor laser (LT09OMD, main wavelength: 830 nm, laser beam diameter: 5.0 µm, produced by Sharp Co., Ltd.), thereafter the aiming image was subjected to binary coding treatment so as to be converted into the RAW data of 256 gradations, then the dram was rolled at 1000 rpm while exposing the image forming material from the support side of the image forming layer, so as to obtain an image.

2. Invention A

Combining the same apparatus as used in 1 with the means to displace a focus of laser described in Japanese Utility Model Publication No. 2554332, an image was obtained similarly by displacing the focus of laser per pixel to be ±0, −20 µm.

3. Invention B

Using the same apparatus as used in 1, the image was obtained similarly by varying an output power of laser per pixel to be ±0, −20%.

Figure 2:
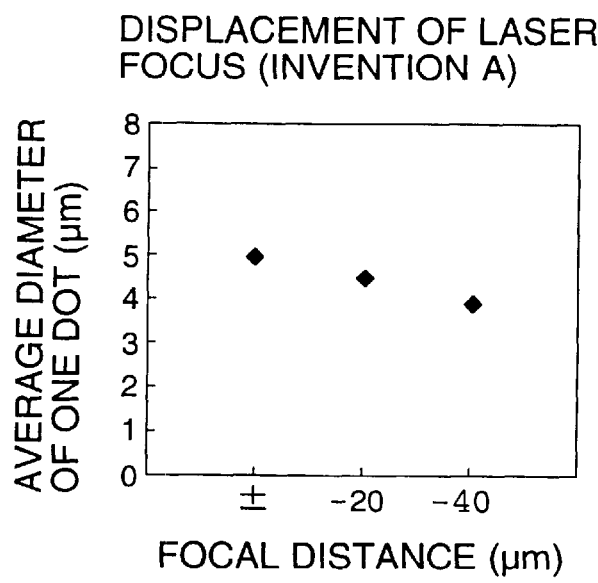
FIG. 2 shows an average diameter of dots when displacing a focus of laser.
Figure 3:
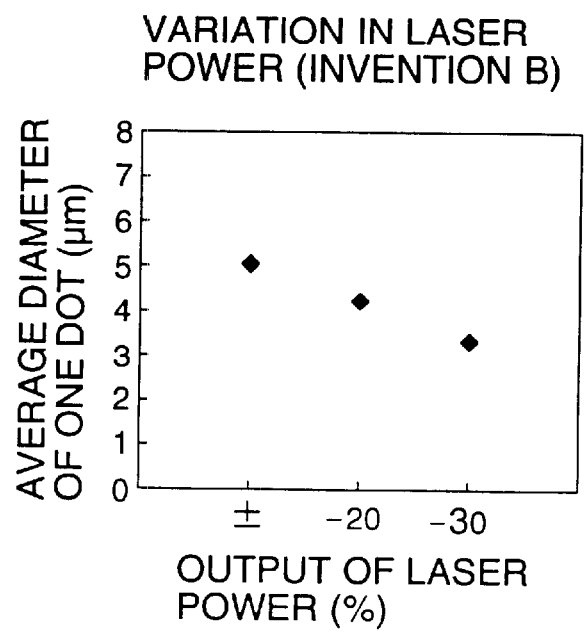
FIG. 3 shows an average diameter of dots when varying laser power.

The visual density of 256 gradations of a formed image recording material was measured by a densitometer (X-rite 310 TR produced by X-rite Co., Ltd.). The resulting transmission density and number of gradation are shown in FIG. 1. An average diameter of one dot obtained by displacing the focus of the laser is shown in FIG. 2, and an average diameter of one dot obtained by varying the output power of the laser is shown in FIG. 3. In FIG. 2 and 3, are shown the average diameter of dot when the focus of the laser is displaced to be −40 µm and the average diameter of dot when the output power of the laser is varied to be −30% for reference.

As can be seen from FIG. 1, 2, and 3, according to the present embodiment, without increasing the density of the pixel, based on the image information having the ternary coding density information, by controlling the laser spot diameter and then exposing an image recording material to the laser beam light, the image forming method for making gradation of the image recording material having binary coding image density gradation high enough by varying the dot diameter was obtained.

Example 2

On an adhesion promotive surface of a polyethyleneterephthalate film having a thickness of 38 µm (T100E, produced by Diafoil Hoechst Co., Ltd.) as the first support, which was subjected to an adhesion promoting treatment, was coated 20% polyurethane (Neotac R-9619, produced by ICI Japan Co., Ltd.) diluted with distilled water by using bar coater, then dried. Thus a stress absorbing layer having a dry thickness of 0.5 μm was formed.

Thereafter, styrene type resin (Lyetac A 200 PC, produced by Mitsui Toatsu Chemicals Co., Ltd.) solution, dissolved in a mixture of toluene/methylethylketone=1/1, having 5% solid part, was coated by using an extrusion coater on the stress absorbing layer, then dried. Thus a heat active image forming layer having a dry thickness of 0.9 μm was formed.

A dispersion solution A was prepared by mixing carbon black having an average particle size of 0.08 μm, polyvinylalcohol (Gosenol EG-30, produced by Nihon Gosei Kagaku Co., Ltd.), styrene type dispersing agent (Johncryl 67, produced by Johnson Wax Co., Ltd.), and 1,4-butanedioldiglycidylether in a ratio of 5/1/0.5/0.18, and dispersing the mixture in a distilled water using a sand mill. The content of the mixture in the dispersion solution A was 20%. Separately, a dispersion solution B was prepared by mixing 4 parts of propyl galate and one part of surfactant (Tryton×200, produced by Roum and Haas Japan Co., Ltd.) and 20 parts of distilled water, and dispersing the mixture by using a sand mill. The dispersion solution B of developing agent composition containing 20% solid component having an particle size of 0.05 μm was prepared.

Thus obtained 100 parts of the dispersion solution A and 10 parts of the dispersion solution B were mixed, then dispersed by using an ultrasonic homogenizer. Thus obtained coating solution was coated on the heat active image forming layer by using an extrusion coater and dried so as to obtain a porous image forming layer having dry thickness of 1.0 μm.

Separately, a dispersion solution was prepared as follows. Polyvinylalcohol (Gosenol GL-05, produced by Nihon Gosei Kagaku Co., Ltd.), maleic acid anhydrite copolymer resin (Gantrez S-97, GAF Co., Ltd.), fluorine-containing type surfactant (Florad FC-120, produced by Sumitomo 3M Co., Ltd.) were mixed in a ratio of 21/0.6/0.2, and were dissolved in distilled water. The content of the mixture in the above solution was 15%. To 100 parts of the above obtained solution was added 20.6 parts of silica (Aerojell 200, Japan Aerojell Co., Ltd.) and dispersed by using an ultrasonic homogenizer. Thereafter, to the above obtained solution was added 6.88 parts of styrene type resin (20% solution dissolved in distilled water, Johncryl 67, produced by Johnson Wax Co., Ltd.), and thus obtained mixture was dispersed by using the ultrasonic homogenizer so as to obtain a coating solution. The coating solution was coated by using the extrusion coater and dried so as to obtain a peeling layer having dry thickness of 1.0 μm.

Further, on the peeling layer was coated a coating solution consisting of 20% solution of vinylidene chloride (diluted with distilled water, Daran SL-11 produced by WR Grace Co., Ltd.) and sodium sulfosuccinic ester (Aerosol-OT, produced by Aero Products & Chemicals) in a ratio of 70.2/1 by using the extrusion coater, and then dried so as to obtain the first adhesion layer having dry thickness of 2.5 μm.

Separately, on a one side of polyethyleneterephthalate film having thickness of 180 μm as the second support, was coated the second adhesion layer by using the extrusion coater, and then dried. The coating solution to obtain the second adhesion layer consisted of acryl type resin (Elbacite 2045, produced by E.I. Dupont de Nemours Co., Ltd.), 50% acryl type resin (Doresco RAC-102, produced by Dock Resin Co., Ltd.), methoxyhydroquinone, 2,2-dimethoxy-2-phenylacetophenone (Irgacure 651, produced by Japan Ciba Geigy Co., Ltd.), antioxidant (blend of Irganox 1010/ Irganox 1035 in a ratio of 1:1, produced by Japan Ciba Geigy Co., Ltd.), trimethylolpropanetriacrylate (Carayad TMPTA, produced by Nihon Kayaku Co., Ltd.), ethylacrylate in a ratio of 11/240/0.1/14/0.7/50/13, and thus obtained coating solution was dissolved in methylethyl ketone so that the content of the solid components of the second adhesion layer was 30%. The resulting second adhesion layer had dry thickness of 17 μm.

On the above obtained first adhesion layer coated on the first support was superposed on the second adhesion layer coated on the second support, then treated by heat and pressure by using a heat roll (temperature of roll; 40° C., transport speed; 100 mm/sec., pressure; 6.0 kg/cm), thereafter the first adhesion layer coated on the first support and the second adhesion layer coated on the second support were pasted together with by exposing ultraviolet rays from the second support side so as to prepare the image forming material.

By using thus obtained image forming material, the image forming was carried out in the same way as used in example 1 and evaluated. Thus obtained result is shown in FIG. 4.

Figure 4:
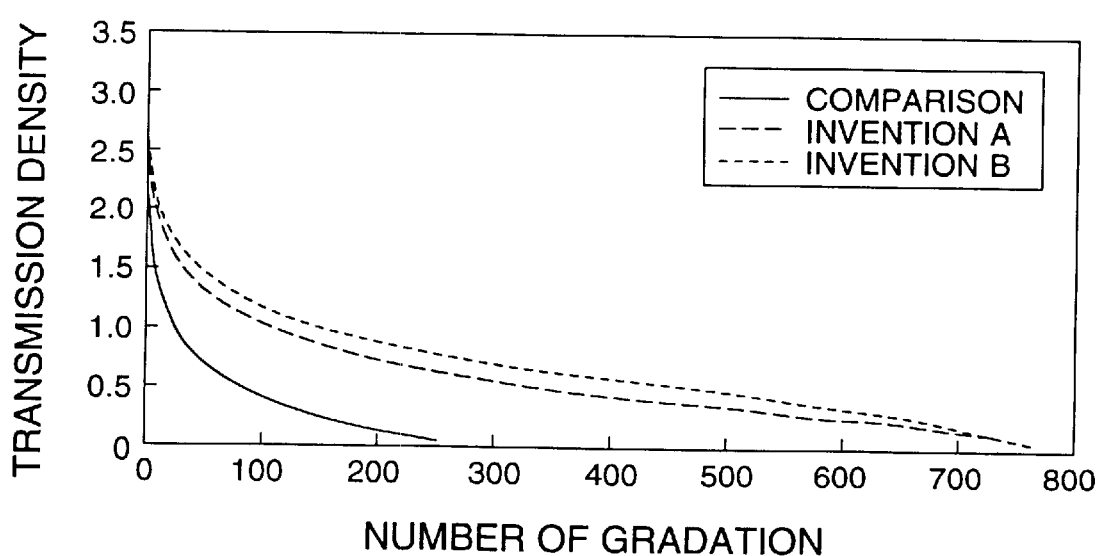
FIG. 4 shows a relationship between transmission density and number of gradation according to the invention.

As can be seen from FIG. 4, by using the heat melting adhesion type image forming material according to the invention, the image forming method, in which an image density garadation composed of binary coding image is made to be a high gradation of the image, was obtained as well as example 1.

According to the present invention, an increased density of the image forming material in which the image composed of binary coding image density is formed was obtained and the image forming method to give gradation to the image forming material in which the image composed of binary coding image density is formed was obtained.

Disclosed embodiment can be varied by a skilled person without departing from the spirit and scope of the invention.

What is claimed is:

1. An image forming method comprising the following steps,
   a step for imagewise exposing a recording material having an image forming layer to a laser beam light based on an image information and making at least a part of an exposed portion of said image forming layer removable,
   a step for forming an image by removing said image forming layer which is removable,
   wherein (i) a removable amount of said image forming layer by radiation of said laser beam light corresponding to one dot is variable in response to said image information and an image having gradation made by area gradation is formed; (ii) said image forming layer comprises a coloring material or a precursor of a coloring material, and thickness of said image forming layer is 0.05 to 5.0 μm; and (iii) said image information has ternary or more coding density information and said removable amount of said image forming layer by radiation of said laser beam light corresponding to one dot is variable in response to said density information.

2. An image forming method comprising the following steps,
   a step for imagewise exposing a recording material having an image forming layer to a laser beam light based on an image information and making at least a part of an exposed portion of said image forming layer removable,
   a step for forming an image by removing said image forming layer which is removable, wherein (i) a removable amount of said image forming layer by radiation of said laser beam light corresponding to one dot is variable in response to said image information and an image having gradation made by area gradation is formed; (ii) said image forming layer comprises a coloring material or a precursor of a coloring material, and thickness of said image forming layer is 0.05 to 5.0 $\mu$m; and (iii) varying an average diameter of removable dots of said image forming layer makes said removable amount of said image forming layer variable.

3. An image forming method comprising the following steps, a step for imagewise exposing a recording material having an image forming layer to a laser beam light based on an image information and making at least a part of an exposed portion of said image forming layer removable, a step for forming an image by removing said image forming layer which is removable, wherein (i) a removable amount of said image forming layer by radiation of said laser beam light corresponding to one dot is variable in response to said image information and an image having gradation made by area gradation is formed; (ii) said image forming layer comprises a coloring material or a precursor of a coloring material, and thickness of said image forming layer is 0.05 to 5.0 $\mu$m; and (iii) by varying a laser spot diameter of said laser beam light, radiation of said laser beam light corresponding to one dot makes a removable amount of said image forming layer variable.

4. The image forming method of claim 3, wherein said laser spot diameter of said laser beam light is varied by changing a focus of said laser beam light.

* * * * *